(12) United States Patent
Chuang et al.

(10) Patent No.: US 6,914,337 B2
(45) Date of Patent: Jul. 5, 2005

(54) CALIBRATION WAFER AND KIT

(75) Inventors: Chih-Nan Chuang, Kaohsiung (TW); Tien-Chen Hu, Pingtung (TW); Tro-Hsu Lin, Tanzih Township, Taichung County (TW); Cheng-Fang Chang, Pingtung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/701,805

(22) Filed: Nov. 4, 2003

(65) Prior Publication Data

US 2005/0091863 A1 May 5, 2005

(51) Int. Cl.⁷ .............................................. H01L 23/544
(52) U.S. Cl. ......................... 257/797; 414/936; 33/645
(58) Field of Search ........................ 33/502, 613, 645; 257/797; 438/401, 462, 975; 414/935, 936, 941

(56) References Cited

U.S. PATENT DOCUMENTS

| | | | | |
|---|---|---|---|---|
| 4,676,649 A | * | 6/1987 | Phillips ........................ 33/1 M |
| 4,934,064 A | * | 6/1990 | Yamaguchi et al. .......... 33/645 |
| 6,156,625 A | * | 12/2000 | Balamurugan ............... 438/462 |
| 6,174,788 B1 | * | 1/2001 | Balamurugan ............... 438/460 |
| 6,207,529 B1 | * | 3/2001 | Jost et al. ..................... 438/401 |
| 6,301,798 B1 | * | 10/2001 | Liu et al. ....................... 33/645 |
| 6,647,632 B2 | * | 11/2003 | Tominaga et al. ............. 33/613 |
| 6,759,274 B2 | * | 7/2004 | Arai et al. ..................... 414/941 |
| 2001/0001900 A1 | * | 5/2001 | Pogge et al. ................... 33/562 |
| 2002/0029936 A1 | * | 3/2002 | McClintock et al. ........ 414/935 |
| 2002/0104231 A1 | * | 8/2002 | Tominaga et al. ...... 33/DIG. 21 |
| 2002/0106579 A1 | * | 8/2002 | Romero ........................ 33/701 |
| 2003/0196343 A1 | * | 10/2003 | Abraham et al. .............. 33/645 |
| 2004/0000729 A1 | * | 1/2004 | Inomata ....................... 257/797 |
| 2004/0092080 A1 | * | 5/2004 | Chen ............................ 438/401 |
| 2004/0099963 A1 | * | 5/2004 | Holloway et al. ........... 257/797 |

* cited by examiner

Primary Examiner—G. Bradley Bennett
(74) Attorney, Agent, or Firm—Tung & Associates

(57) ABSTRACT

A calibration wafer which is suitable for calibrating alignment of a transfer robot blade with respect to wafers in a loadlock chamber or input shuttle. The calibration wafer includes a circular wafer body on which is provided a pair of spaced-apart blade alignment lines which are used to properly align the transfer robot blade. The invention further includes a calibration kit for calibrating alignment of a polishing head with a pedestal, including a base plate for placement on the pedestal; a calibration plate for placement on the base plate; and a calibration circle provided on the calibration plate for aligning the polishing head with the pedestal.

15 Claims, 4 Drawing Sheets

CALIBRATION WAFER AND KIT

FIELD OF THE INVENTION

The present invention relates to CMP (chemical mechanical planarization) apparatus for polishing or planarizing semiconductor wafer substrates in the fabrication of semiconductor integrated circuits. More particularly, the present invention relates to a calibration wafer for calibrating a robot blade to properly transfer wafers from a loadlock chamber of a CMP apparatus or from an input shuttle of a post-CMP wet cleaning tank, and to a calibration kit for CMP head sweep and HCLU hand-off position calibration.

BACKGROUND OF THE INVENTION

In the fabrication of semiconductor devices from a silicon wafer, a variety of semiconductor processing equipment and tools are utilized. One of these processing tools is used for polishing thin, flat semiconductor wafers to obtain a planarized surface. A planarized surface is highly desirable on a shadow trench isolation (STI) layer, inter-layer dielectric (ILD) or on an inter-metal dielectric (IMD) layer, which are frequently used in memory devices. The planarization process is important since it enables the subsequent use of a high-resolution lithographic process to fabricate the next-level circuit. The accuracy of a high resolution lithographic process can be achieved only when the process is carried out on a substantially flat surface. The planarization process is therefore an important processing step in the fabrication of semiconductor devices.

A global planarization process can be carried out by a technique known as chemical mechanical polishing, or CMP. The process has been widely used on ILD or IMD layers in fabricating modern semiconductor devices. A CMP process is performed by using a rotating platen in combination with a pneumatically-actuated polishing head. The process is used primarily for polishing the front surface or the device surface of a semiconductor wafer for achieving planarization and for preparation of the next level processing. A wafer is frequently planarized one or more times during a fabrication process in order for the top surface of the wafer to be as flat as possible. A wafer can be polished in a CMP apparatus by being placed on a carrier and pressed face down on a polishing pad covered with a slurry of colloidal silica or aluminum.

A polishing pad used on a rotating platen is typically constructed in two layers overlying a platen, with a resilient layer as an outer layer of the pad. The layers are typically made of a polymeric material such as polyurethane and may include a filler for controlling the dimensional stability of the layers. A polishing pad is typically made several times the diameter of a water in a conventional rotary CMP, while the wafer is kept off-center on the pad in order to prevent polishing of a non-planar surface onto the wafer. The wafer itself is also rotated during the polishing process to prevent polishing of a tapered profile onto the wafer surface. The axis of rotation of the wafer and the axis of rotation of the pad are deliberately not collinear; however, the two axes must be parallel. It is known that uniformity in wafer polishing by a CMP process is a function of pressure, velocity and concentration of the slurry used.

A CMP process is frequently used in the planarization of an ILD or IMD layer on a semiconductor device. Such layers are typically formed of a dielectric material. A most popular dielectric material for such usage is silicon oxide. In a process for polishing a dielectric layer, the goal is to remove typography and yet maintain good uniformity across the entire wafer. The amount of the dielectric material removed is normally between about 5000 Å and about 10,000 Å. The uniformity requirement for ILD or IMD polishing is very stringent since non-uniform dielectric films lead to poor lithography and resulting window-etching or plug-formation difficulties. The CMP process has also been applied to polishing metals, for instance, in tungsten plug formation and in embedded structures. A metal polishing process involves a polishing chemistry that is significantly different than that required for oxide polishing.

Important components used in CMP processes include an automated rotating polishing platen and a wafer holder, which both exert a pressure on the wafer and rotate the wafer independently of the platen. The polishing or removal of surface layers is accomplished by a polishing slurry consisting mainly of colloidal silica suspended in deionixed water or KOH solution. The slurry is frequently fed by an automatic slurry feeding system in order to ensure uniform wetting of the polishing pad and proper delivery and recovery of the slurry. For a high-volume wafer fabrication process, automated wafer loading/unloading and a cassette handler are also included in a CMP apparatus.

As the name implies, a CMP process executes a microscopic action of polishing by both chemical and mechanical means. While the exact mechanism for material removal of an oxide layer is not known, it is hypothesized that the surface layer of silicon oxide is removed by a series of chemical reactions which involve the formation of hydrogen bonds with the oxide surface of both the wafer and the slurry particles in a hydrogenation reaction; the formation of hydrogen bonds between the wafer and the slurry; the formation of molecular bonds between the wafer and the slurry; and finally, the breaking of the oxide bond with the wafer or the slurry surface when the slurry particle moves away from the wafer surface. It is generally recognized that the CMP polishing process is not a mechanical abrasion process of slurry against a wafer surface.

While the CMP process provides a number of advantages over the traditional mechanical abrasion type polishing process, a serious drawback for the CMP process is the difficulty in controlling polishing rates at different locations on a wafer surface. Since the polishing rate applied to a wafer surface is generally proportional to the relative rotational velocity of the polishing pad, the polishing rate at a specific point on the wafer surface depends on the distance from the axis of rotation. In other words, the polishing rate obtained at the edge portion of the wafer that is closest to the rotational axis of the polishing pad is less than the polishing rate obtained at the opposite edge of the wafer. Even though this is compensated for by rotating the wafer surface during the polishing process such that a uniform average polishing rate can be obtained, the wafer surface, in general, is exposed to a variable polishing rate during the CMP process.

Recently, a chemical mechanical polishing method has been developed in which the polishing pad is not moved in a rotational manner but instead, in a linear manner. It is therefore named as a linear chemical mechanical polishing process, in which a polishing pad is moved in a linear manner in relation to a rotating wafer surface. The linear polishing method affords a more uniform polishing rate across a wafer surface throughout a planarization process for the removal of a film layer from the surface of a wafer. One added advantage of the linear CMP system is the simpler construction of the apparatus, and this not only reduces the cost of the apparatus but also reduces the floor space required in a clean room environment.

A typical conventional CMP apparatus 90 is shown in FIG. 1 and includes a base 100; polishing pads 210a, 210b, and 210c provided on the base 100; a head clean load/unload (HCLU) station 360 which includes a load cup 300 for the loading and unloading of wafers (not shown) onto and from, respectively, the polishing pads; and a head rotation unit 400 having multiple polishing pads 410a, 410b, 410c and 410d for holding and fixedly rotating the wafers on the polishing pads.

The three polishing pads 210a, 210b and 210c facilitate simultaneous processing of multiple wafers in a short time. Each of the polishing pads is mounted on a rotatable carousel (not shown). Pad conditioners 211a, 211b and 211c are typically provided on the base 100 and can be swept over the respective polishing pads for conditioning of the polishing pads. Slurry supply arms 212a, 212b and 212c are further provided on the base 100 for supplying slurry to the surfaces of the respective polishing pads.

The polishing heads 410a, 410b, 410c and 410d of the head rotation unit 400 are mounted on respective rotation shafts 420a, 420b, 420c, and 420d which are rotated by a driving mechanism (not shown) inside the frame 401 of the head rotation unit 400. The polishing heads hold respective wafers (not shown) and press the wafers against the top surfaces of the respective polishing pads 210a, 210b and 210c. In this manner, material layers are removed from the respective wafers. The head rotation unit 400 is supported on the base 100 by a rotary bearing 402 during the CMP process.

The load cup 300 includes a pedestal support column 312 that supports a circular pedestal 310 on which the wafers are placed for loading of the wafers onto the polishing pads 210a, 210b and 210c, and unloading of the wafers from the polishing pads. A pedestal film 313 is typically provided on the upper surface of the pedestal 310 for contacting the patterned surface (the surface on which IC devices are fabricated) of each wafer.

Fluid openings 314 extend through the pedestal 310 and pedestal film 313. The bottom surfaces of the polishing heads 410a, 410b, 410c and 410d and the top surface of the pedestal film 313 are washed at the load cup 300 by the ejection of washing fluid through the fluid openings 314.

Each wafer is loaded by a transfer robot (not shown) from a loadlock chamber (not shown), onto the load cup 300. The transfer robot includes a robot blade that is inserted into the loadlock chamber and lifts each wafer individually from the loadlock chamber and places the wafer to the pedestal 310 of the load cup 300. Before the wafer transfer procedure, the robot blade must be calibrated to contact the wafer in the loadlock chamber in order to correctly lift the wafer from the loadlock chamber. This calibration procedure is typically labor-intensive and requires a long time to complete. Accordingly, a novel device and procedure is needed for expeditiously calibrating a robot blade for proper alignment of the blade with respect to a wafer in a loadlock chamber.

After it is loaded onto the pedestal 310, the wafer is loaded from the pedestal 310 onto one of the polishing heads 410a-410d on the head rotation unit 400. The polishing head must be properly aligned with the wafer in order to facilitate proper loading of the wafer onto the polishing head. This alignment procedure is labor-intensive and requires much trial-and-error. Accordingly, a novel calibration device and procedure is needed to expeditiously calibrate a polishing head on a head rotation unit of a CMP apparatus to align the polishing head with respect to a wafer on a load cup.

An object of the present invention is to provide a novel device for calibrating a transfer robot blade for proper alignment of the blade with respect to a wafer in a loadlock chamber.

Another object of the present invention is to provide a novel calibration wafer to facilitate proper positional and planar alignment of a transfer robot blade with respect to a wafers in a loadlock chamber.

Still another object of the present invention is to provide a novel calibration kit for calibrating alignment of a polishing head on a head rotation unit of a CMP apparatus with respect to a wafer on a load cup of the apparatus.

Yet another object of the present invention is to provide a novel calibration kit which includes a cooperating calibration plate and base plate to calibrate alignment of a polishing head with respect to a wafer.

A still further object of the present invention is to provide a novel calibration kit which is suitable for performing HCLU (Head Clean Load/Unload) hand-off position calibration.

SUMMARY OF THE INVENTION

In accordance with these and other objects and advantages, the present invention is generally directed to a novel calibration wafer which is suitable for calibrating alignment of a transfer robot blade with respect to wafers in a loadlock chamber. The calibration wafer includes a circular wafer body on which is provided a pair of spaced-apart blade alignment lines. The wafer is placed in the loadlock chamber, and the shoulder angle of the blade is adjusted to align the lateral edges of the blade with the blade alignment lines. The wrist angle of the blade is adjusted to align the plane of the blade with the plane of the calibration wafer. The Z-axis position of the blade is adjusted to properly position the blade for engaging and then lifting each wafer from the loadlock chamber. The calibration wafer is also suitable for calibrating alignment of a transfer robot blade with respect to wafers in an input shuttle of a wet cleaning tank.

The present invention is further directed to a calibration kit which is suitable for calibrating the alignment of a polishing head on a CMP apparatus with respect to a wafer on a load cup pedestal at an HCLU station of the apparatus to properly load the wafer on the polishing head. The calibration kit includes a base plate which is placed on the pedestal and a calibration plate which is placed on the base plate. A colored circle is provided on the upper surface of the calibration plate. The head rotation unit on which the polishing heads are mounted is rotated to sequentially locate each polishing head to a position directly over the calibration plate. Each polishing head is calibrated to align with the colored circle, at which point the polishing head is correctly calibrated for proper loading of a wafer from the load cup pedestal onto the polishing head. The calibration kit is also suitable for performing HCLU hand-off position calibration.

BRIEF DESCRIPTION OF THE DRAWINGS

The invention will be better understood, by way of example, with reference to the accompanying drawings, in which.

DETAILED DESCRIPTION OF THE INVENTION

Figure 1:
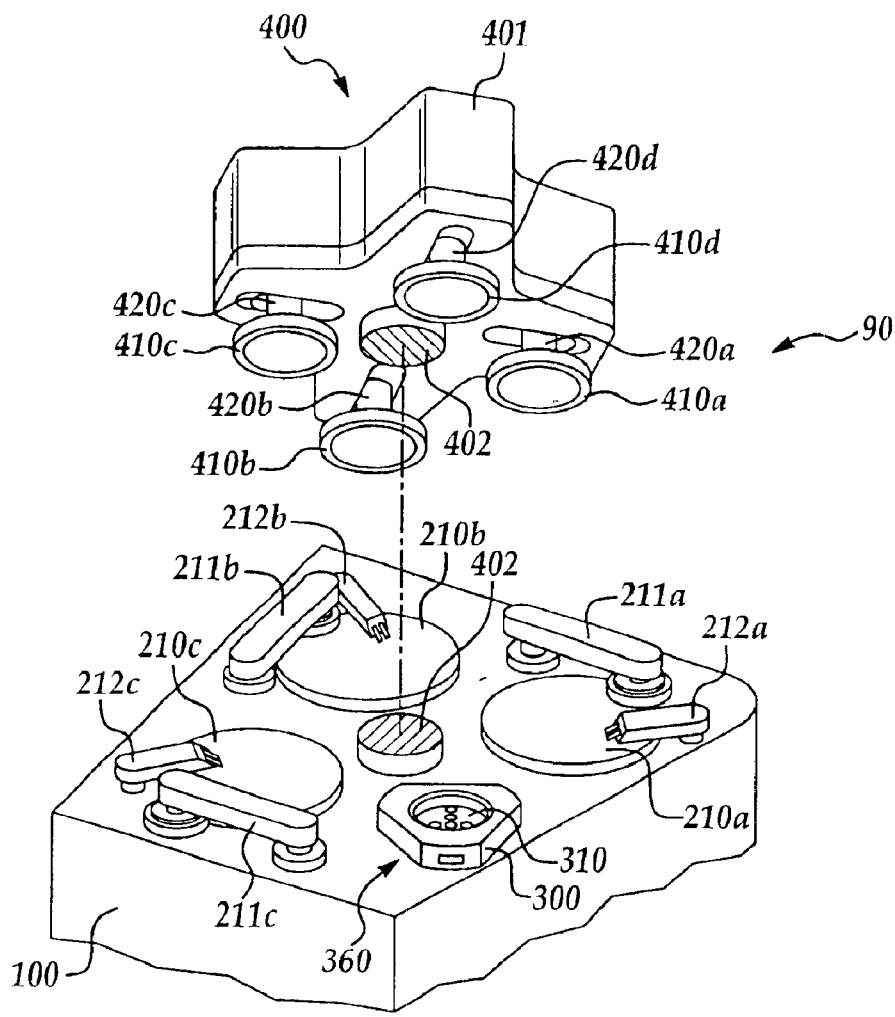
FIG. 1 is a perspective view of a typical conventional chemical mechanical polishing apparatus for the successive polishing of wafers.
Figure 1A:
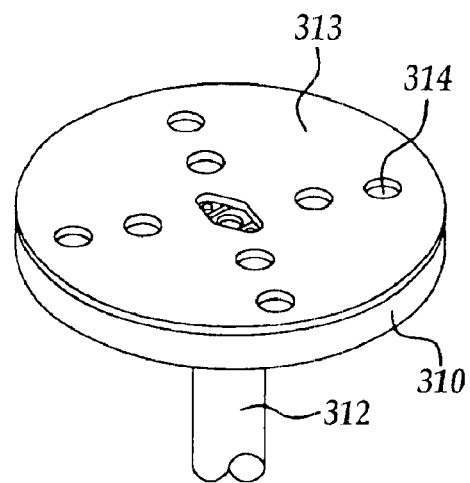
FIG. 1A is a top perspective view, partially in section, of a conventional pedestal assembly of the CMP apparatus of FIG. 1.

Referring initially to FIGS. 2–7, a calibration wafer 10 of the present invention is used to calibrate alignment of a transfer robot blade 28 with respect to wafers (not shown) in a loadlock chamber 24 of a Mirra Mesa CMP apparatus, as hereinafter described, although the calibration wafer 10 may be applicable to apparatus other than a Mirra Mesa CMP apparatus. The transfer robot blade 28 has an elongated, rectangular configuration and includes lateral edges 29 and a front edge 30. The transfer robot blade 28 is used to transfer the wafers from the loadlock chamber 24 to a load cup (not shown) on the CMP apparatus.

Figure 3:
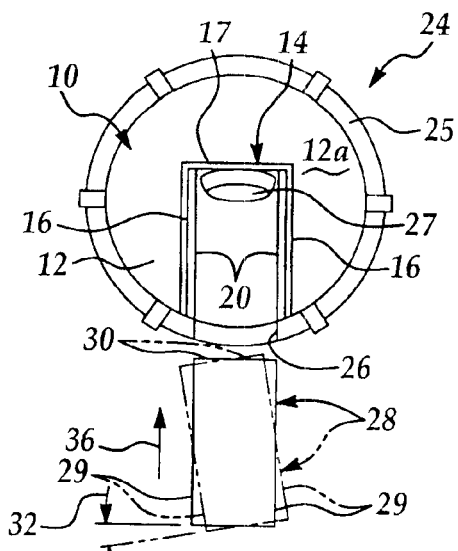
FIG. 3 is a top view of a loadlock chamber of a conventional Mirra Mesa CMP apparatus, with the calibration wafer of FIG. 2 placed in the loadlock chamber, illustrating adjustment of a shoulder angle of a transfer robot blade in use of the calibration wafer.

As shown in FIG. 3, the CMP loadlock chamber 24 typically includes a chamber wall 25 having a blade slot 26 through which the robot blade 28 is inserted to engage and lift each wafer from the loadlock chamber 25, as is known by those skilled in the art. A stop wall 27 is included in the loadlock chamber 24 to engage and stop forward movement of the robot blade 28 when the robot blade 28 is properly positioned for engaging and lifting the wafers from the CMP loadlock chamber 24.

Figure 2:
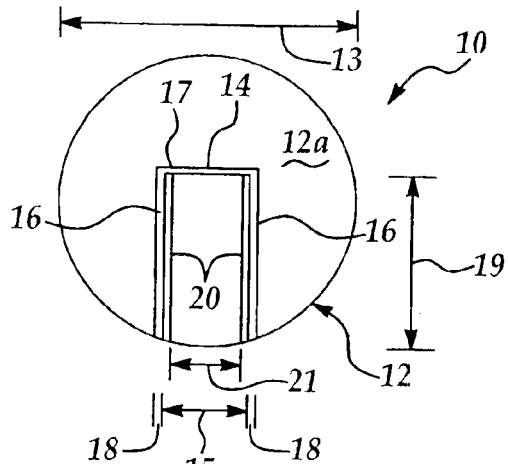
FIG. 2 is a top view of a calibration wafer according to the present invention.

As shown in FIG. 2, the calibration wafer 10 includes a wafer body 12 which may be a transparent material such as PLEXIGLASS (trademark) or an opaque material such as polycarbonate. The wafer body 12 has a width 13 of typically 200 mm and a thickness of typically about 0.5 mm. A scale mark 14 is painted or otherwise provided on the upper surface 12a of the wafer body 12. The scale mark 14 includes a pair of spaced-apart, parallel lateral scale lines 16 which extend from the edge of the wafer body 12 and are connected by a stop wall line 17.

The lateral scale lines 16 are spaced from each other by a scale mark width 15 of typically about 72 mm. Each of the lateral scale lines 16 and the stop wall line 17 has a scale line thickness 18 of typically about 5 mm. Each of the lateral scale lines 16 has a scale line length 19 of typically about 125 mm.

A pair of parallel, elongated blade alignment lines 20 is painted or otherwise provided on the upper surface 12a of the wafer body 12, between the lateral scale lines 16. The blade alignment lines 20 are separated from each other by a line spacing 21 of typically about 70 mm. The line spacing 21 of 70 mm between the blade alignment lines 20 corresponds to the width, or the distance between the lateral edges 29, of the transfer robot blade 28.

Figure 7:
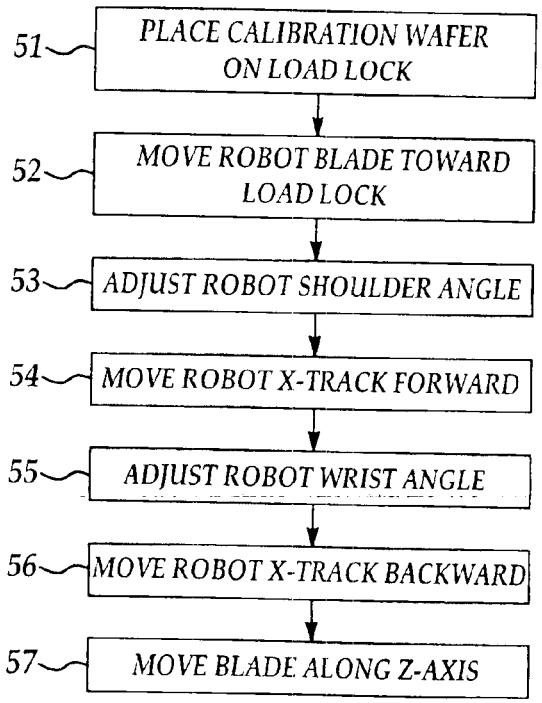
FIG. 7 is a flow diagram illustrating a typical flow of calibration steps: in use of the calibration wafer.

In use of the calibration wafer 12 to calibrate alignment of the transfer robot blade 28 with respect to wafers (not shown) to be transferred from the loadlock chamber 24 to an HCLU station (not shown) of the CMP apparatus, the calibration wafer 10 is initially placed on the loadlock chamber 24, as shown in FIG. 3 and indicated in step S1 of the flow diagram of FIG. 7. The robot blade 28 is then moved along the X-axis 36 toward the loadlock chamber 24, as indicated in step S2. Next, as indicated in step S3, the robot blade shoulder angle 32 is adjusted to align the lateral edges 29 of the robot blade 28 in parallel relationship with respect to the respective blade alignment lines 20 on the calibration wafer 10.

Figure 4:
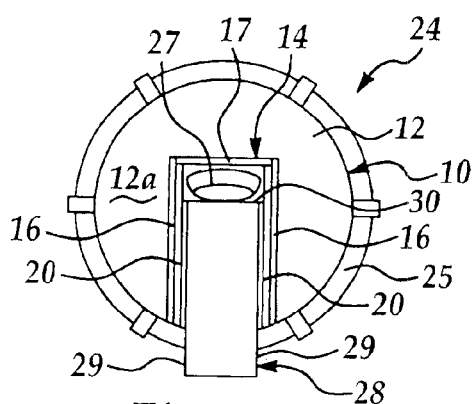
FIG. 4 is a top view of the CMP apparatus loadlock chamber of FIG. 3, illustrating insertion of the transfer robot blade into the loadlock chamber after proper adjustment of the shoulder angle.
Figure 5:
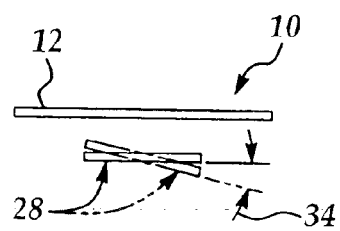
FIG. 5 is a side view of the calibration wafer and the transfer robot blade, illustrating adjustment of a wrist angle of the transfer robot blade in use of the calibration wafer.

After the lateral edges 29 of the robot blade 28 have been properly aligned with the blade alignment lines 20, the robot blade 28 is then moved forward, along the X-axis 36, as indicated in step S4, to insert the robot blade 28 into the loadlock chamber 24 through the blade slot 26, until the front edge 30 of the robot blade 28 contacts the stop wall 27, as shown in FIG. 4. The lateral scale lines 16 of the scale mark 14 indicate the approximate distance between the front edge 30 of the robot blade 28 and the stop wall 27. Next, as indicated in step S5 and illustrated in FIG. 5, the robot wrist angle 34 is adjusted until the plane of the robot blade 28 parallels the plane of the calibration wafer 10. As indicated in step S6, the robot blade 28 is then moved rearwardly along the X-axis 36 to remove the robot blade 28 from the loadlock chamber 24.

Figure 6:
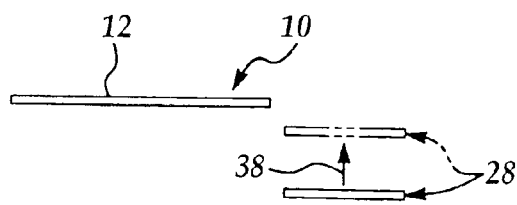
FIG. 6 is a side view of the calibration wafer and the transfer robot blade, illustrating adjustment of the robot blade along the Z-axis in use of the calibration wafer.

Finally, as indicated in step S7 and shown in FIG. 6, the robot blade 28 is adjusted with respect to the calibration wafer 10 along the Z-axis 38 to properly position the robot blade 28 for engaging and lifting actual wafers from the loadlock chamber 24. The robot blade 28 is thus properly calibrated for transferring actual wafers from the loadlock chamber 24 to the load cup (not shown) on the CMP apparatus. The calibration wafer 10 is removed from the loadlock chamber 24 prior to operation of the robot blade 28.

Figure 8:
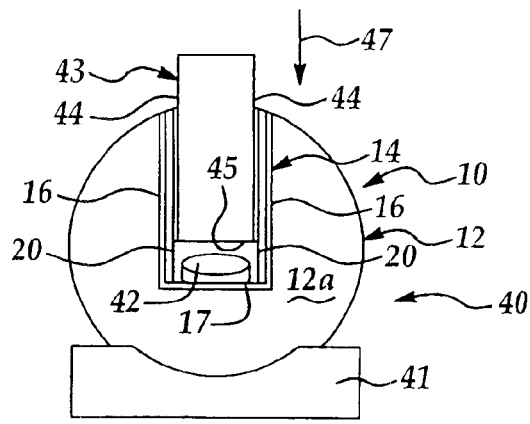
FIG. 8 is a side view of an input shuttle of a wet cleaning tank, with the calibration wafer of FIG. 2 placed in the input shuttle, illustrating insertion of a transfer robot blade into the input shuttle after proper adjustment of the blade with respect to the wafer.
Figure 9:
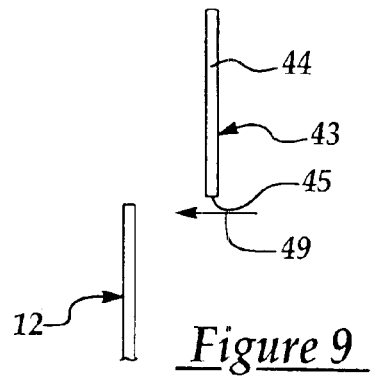
FIG. 9 is a side view of the transfer robot blade and the wafer of FIG. 8, illustrating movement of the blade along the X-axis to contact the wafer.

Referring next to FIGS. 8 and 9, the calibration wafer 10 can be used to calibrate the alignment position of a transfer robot blade 43 with respect to wafers (not shown) in an input shuttle 40 of a wet cleaning tank (not shown) for transfer of the wafers into and from the input shuttle 40. The robot blade 43 is typically elongated and rectangular and has a pair of lateral edges 44 and a bottom edge 45. The input shuttle 40 typically includes a base 41 which receives the wafers. A stop wall 42 is provided in the input shuttle 40 to block further downward movement of the robot blade 43 along the Z-axis 47 during the wafer-transfer process.

In application, the calibration wafer 10 is placed in the input shuttle 40. The robot blade 43 is then moved downwardly along the Z-axis 47, toward the input shuttle 4.0. Next, the robot shoulder angle is adjusted until the lateral edges 44 of the robot blade 43 are parallel to the respective blade alignment lines 20 on the calibration wafer 10. The robot blade 43 is then moved downwardly along the Z-axis 47 until the bottom edge 45 contacts the stop wall 42, after which the robot wrist angle is adjusted until the plane of the robot blade 43 parallels the plane of the calibration wafer 10.

Calibration is completed by first raising the robot blade 43 along the Z-axis 47, to clear the calibration wafer 10, and then adjusting the transfer robot blade 43 along the X-axis 49 to properly place the robot blade 43 in the pick-up position for engaging and transferring wafers from the input shuttle 40. After calibration, the calibration wafer 10 is removed from the input shuttle 40.

Referring next to FIGS. 10–12F, a calibration kit 52 (FIG. 12B) of the present invention includes a base plate 53 and a calibration plate 60. The calibration kit 52 is used to calibrate the alignment of a polishing head 70 of an HCLU (Head Clean Load/Unload) station 66 of a CMP apparatus, such as a Mirra Mesa CMP apparatus. The HCLU station 66 includes a load cup 67 in which is mounted a vertically-adjustable pedestal 68 provided on the upper end of a pedestal shaft 69. The polishing head 70 is typically one of multiple polishing heads mounted on a head rotation unit (not shown) above the CMP apparatus. While the head rotation unit can be rotated to position any of the multiple polishing heads 70 above the HCLU station 66, the alignment of each polishing head 70 with respect to the pedestal 68 must be calibrated for proper loading of a wafer (not shown) from the pedestal 68 onto the polishing head 70.

Figure 10:
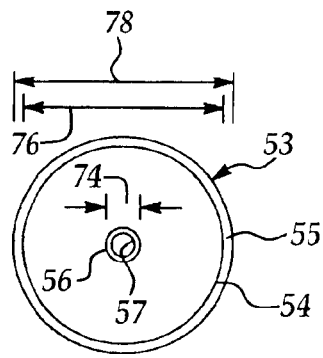
FIG. 10 is a top view of a base plate component of a calibration kit of the present invention.
Figure 10A:
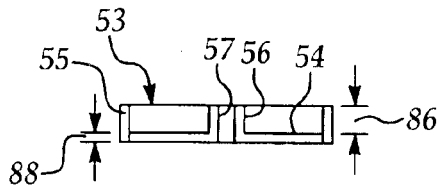
FIG. 10a is a cross-section of the base plate of FIG. 10.

As shown in FIGS. 10 and 10A, the base plate 53 of the calibration kit 52 includes a circular body 54 having an upward-standing rim 55. A nipple 56, having a nipple opening 57, extends upwardly from the center of the body 54. As shown in FIG. 10, the nipple 56 has a nipple diameter 74 of typically about 20 mm; the base plate body 54 has a body diameter 76 of typically about 186 mm; and the rim 55 has a rim diameter 78 of typically about 203 mm. As shown in FIG. 10A, the rim 55 has a rim height 86 of typically about 12 mm, and the base plate body 54 has a body thickness 88 of typically about 5 mm.

Figure 11:
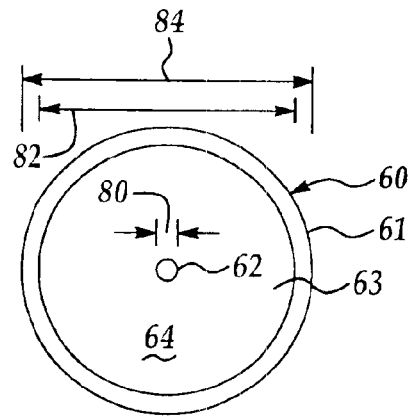
FIG. 11 is a top view of a calibration plate component of the calibration kit.
Figure 11A:
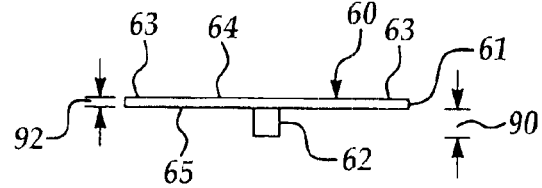
FIG. 11A is a cross-sectional view of the calibration plate of FIG. 11.

As shown in FIGS. 11 and 11A, the calibration plate 60 of the calibration kit 52 includes a body 61 having a body diameter 84 of typically about 260 mm. A plate extension 62, having an extension diameter 80 of typically about 20 mm, extends downwardly from the bottom surface 65 of the body 61. A calibration circle 63 is painted or otherwise provided on the upper surface 64 of the plate body 61. Preferably, the calibration circle 63 has the same diameter as that of the polishing head 70. In a preferred embodiment, the calibration circle 63 has a circle diameter 82 of typically about 248 mm. As shown in FIG. 11A, the plate extension 62 has an extension height 90 of typically about 12 mm. The plate body 61 has a body thickness 92 of typically about 3 mm.

Figure 12A:
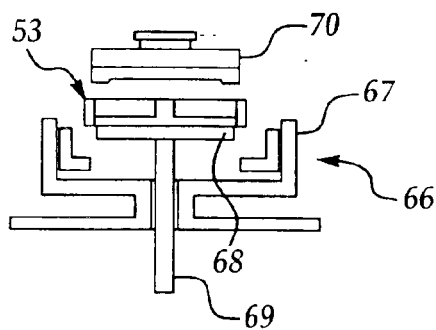
FIG. 12A is a schematic view of a load cup on an HCLU station of a CMP apparatus, with the base plate of the calibration kit placed on the pedestal of the load cup.
Figure 12B:
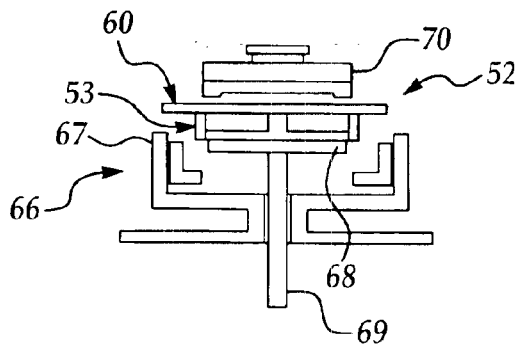
FIG. 12B is a schematic view of the load cup of FIG. 12a, with the calibration plate placed on the base plate.

As illustrated in FIGS. 12A–12F, each polishing head 70 of the CMP apparatus is calibrated for alignment with the pedestal 68 of the HCLU station 66, as follows. First, as shown in FIG. 12A, the base plate 53 is placed on the pedestal 68, with the nipple 56 extending upwardly. Next, as shown in FIG. 12B, the calibration plate 60 is lowered in place onto the base plate 53 by inserting the plate extension 62 downwardly into the nipple opening 57 of the nipple 56 on the base plate 53.

Figure 12C:
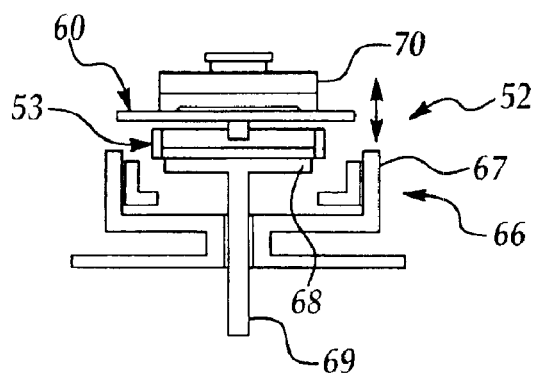
FIG. 12C is a schematic view of the load cup, illustrating movement of the calibration plate into contact with the polishing head by upward extension of the pedestal.
Figure 12D:
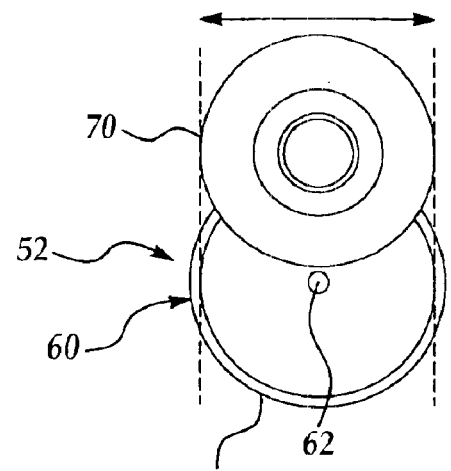
FIG. 12D is a top view of a CMP polishing head and the calibration plate of the calibration kit, illustrating alignment of the left and right sides of the polishing head with the calibration plate.
Figure 12E:
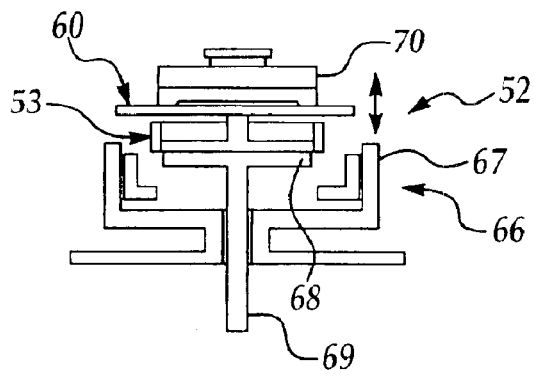
FIG. 12E is a schematic view of the load cup, illustrating movement of the calibration plate into contact with the polishing head.

After the calibration plate 60 is placed on the base plate 53, cross-homing steps are performed and the first polishing head 70 to be calibrated is moved to the load cup position. As shown in FIG. 12C, the pedestal 68 may be raised to determine whether the left and right sides of the polishing head 70 are aligned with the calibration circle 63 on the calibration plate 60. If not, then the cross home angle of the polishing head 70 is adjusted or corrected until the left and right sides of the polishing head 70 are aligned with the calibration circle 63, as shown in FIG. 12D.

Figure 12F:
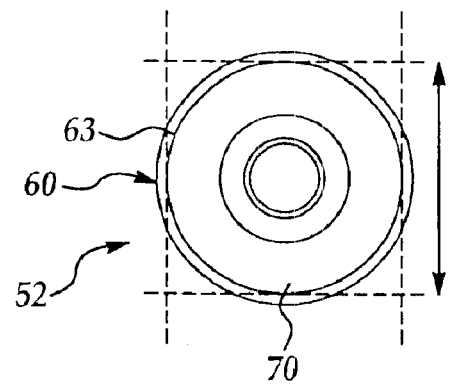
FIG. 12F is a top view of a CMP polishing head, illustrating alignment of the front and rear sides of the polishing head with the calibration plate.

Next, a determination is made as to whether the front and rear sides of the polishing head 70 are aligned with the calibration circle 63 on the calibration plate 60. If not, then the sweep home position of the polishing head 70 is corrected until the front and rear sides of the polishing head are aligned with the calibration circle 63, as shown in FIG. 12F. This completes alignment calibration of the first polishing head 70. The pedestal 68 is lowered, the calibration plate 60 is removed from the base plate 53, and the base plate 53 is removed from the pedestal 68. Accordingly, the first polishing head 70 is properly positioned for subsequent loading of a wafer (not shown) from the pedestal 68 onto the polishing head 70, in operation of the CMP apparatus. The same procedure is then followed to calibrate the second, third and fourth polishing heads 70 on the head rotation unit (not shown).

Figure 13:
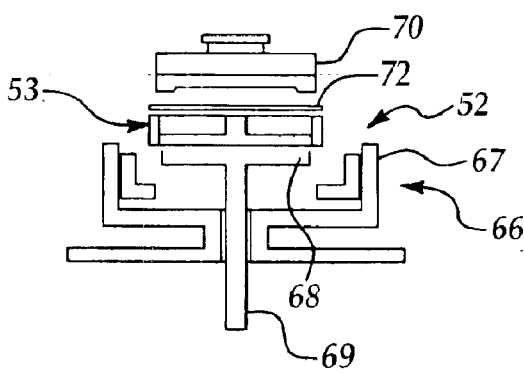
FIG. 13 is a schematic view of a load cup, illustrating use of the base plate and calibration plate in performing an HCLU hand-off position calibration.

Referring next to FIG. 13, by use of the base plate 53 of the calibration kit 52, the HCLU hand-off position can be calibrated, as follows. First, the pedestal 68 is raised and then the base plate 53 is placed on the pedestal 68. Next, the Robot EC constant (HCLU transfer: pick up/drop off/enter/leave z position) is noted, and the Z-axis positions are modified to avoid striking of the transfer robot blade (not shown) against the polishing head 70 and the base plate 53. The transfer robot (not shown) then transfers a wafer 72 from a wafer cassette (not shown) onto the base plate 53, as shown in FIG. 13. The position of the wafer 72 is measured against the base plate 53 to determine whether the HCLU hand-off position is correct. If incorrect, then the correct X-axis position and shoulder angle are used to repeat the transfer procedure until the wafer 72 is correctly centered on the base plate 53. Calibration is completed by adjusting the robot blade to the correct Z-axis position for proper operation.

While the preferred embodiments of the invention have been described above, it will be recognized and understood that various modifications can be made in the invention and the appended claims are intended to cover all such modifications which may fall within the spirit and scope of the invention.

What is claimed is:

1. A calibration wafer for calibrating alignment of a transfer robot blade, comprising:
   a wafer body; and
   a pair of parallel, spaced-apart blade alignment lines provided on said wafer body for aligning the transfer robot blade with the wafer body.

2. The calibration wafer of claim 1 wherein said wafer body comprises a translucent material.

3. The calibration wafer of claim 1 further comprising a scale mark provided on said wafer body.

4. The calibration wafer of claim 3 wherein said wafer body comprises a translucent material.

5. The calibration wafer of claim 1 wherein said wafer body comprises an opaque material.

6. The calibration wafer of claim 5 further comprising a scale mark provided on said wafer body.

7. The calibration wafer of claim 3 wherein said scale mark comprises a pair of lateral scale lines extending adjacent to said pair of blade alignment lines, respectively, and a stop wall line connecting said pair of lateral scale lines.

8. The calibration wafer of claim 7 wherein said wafer body comprises a translucent material.

9. The calibration wafer of claim 7 wherein said wafer body comprises an opaque material.

10. A calibration kit for calibrating alignment of a polishing head with a pedestal, comprising:
    a base plate for placement on the pedestal;
    a calibration plate for placement on said base plate, said base plate comprises a base plate body and a nipple having a nipple opening extending from said base plate body for engaging said calibration plate; and
    a calibration circle provided on said calibration plate for aligning the polishing head with the pedestal.

11. The calibration kit of claim 10 wherein said calibration plate comprises calibration plate body having an upper surface, a bottom surface and a plate extension extending from said bottom surface for engaging said base plate, and wherein said calibration circle is provided on said upper surface.

12. The calibration kit of claim 10 wherein said calibration circle has a diameter of about 248 mm.

13. The calibration kit of claim 12 wherein said calibration plate comprises calibration plate body having an upper surface, a bottom surface and a plate extension extending from said bottom surface for engaging said base plate, and wherein said calibration circle is provided on said upper surface.

14. A calibration kit for calibrating alignment of a polishing head having a head diameter with a pedestal, comprising:
    a base plate for placement on the pedestal;
    a calibration plate for placement on said base plate, said base plate comprises a base plate body and a nipple having a nipple opening extending from said base plate body for engaging said calibration plate; and
    a calibration circle provided on said calibration plate for aligning the polishing head with the pedestal, said calibration circle having a circle diameter substantially equal to the head diameter of the polishing head.

15. The calibration kit of claim 14 wherein said calibration plate comprises calibration plate body having an upper surface, a bottom surface and a plate extension extending from said bottom surface for insertion in said nipple opening of said base plate, and wherein said calibration circle is provided on said upper surface.

* * * * *